(12) United States Patent
Handa et al.

(10) Patent No.: US 12,209,214 B2
(45) Date of Patent: Jan. 28, 2025

(54) LIGHT-EMITTING ELEMENT HAVING A HOLE TRANSPORT LAYER CONTAINING LANIO.SUB.3 FOR LUMINOUS EFFICIENCY

(71) Applicant: SHARP KABUSHIKI KAISHA, Sakai (JP)

(72) Inventors: Shinichi Handa, Sakai (JP); Yoshihiro Ueta, Sakai (JP); Noboru Iwata, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 545 days.

(21) Appl. No.: 17/612,728

(22) PCT Filed: Jun. 24, 2019

(86) PCT No.: PCT/JP2019/025012
§ 371 (c)(1),
(2) Date: Nov. 19, 2021

(87) PCT Pub. No.: WO2020/261347
PCT Pub. Date: Dec. 30, 2020

(65) Prior Publication Data
US 2022/0235265 A1    Jul. 28, 2022

(51) Int. Cl.
| | | |
|---|---|---|
| H10K 50/15 | (2023.01) | |
| C09K 11/77 | (2006.01) | |
| H10K 50/115 | (2023.01) | |
| H10K 50/18 | (2023.01) | |
| H10K 101/30 | (2023.01) | |

(52) U.S. Cl.
CPC ........ C09K 11/7701 (2013.01); *H10K 50/115* (2023.02); *H10K 50/156* (2023.02); *H10K 50/18* (2023.02); *H10K 2101/30* (2023.02)

(58) Field of Classification Search
None
See application file for complete search history.

(56) References Cited

U.S. PATENT DOCUMENTS

| | | |
|---|---|---|
| 2007/0103068 A1 | 5/2007 | Bawendi et al. |
| 2012/0238047 A1 | 9/2012 | Bawendi et al. |
| 2012/0292595 A1 | 11/2012 | Bawendi et al. |
| 2017/0125635 A1 | 5/2017 | Bawendi et al. |
| 2021/0057662 A1* | 2/2021 | Handa .................. H10K 50/115 |
| 2022/0006035 A1* | 1/2022 | Handa .................. H10K 50/16 |
| 2022/0328778 A1* | 10/2022 | Handa .................. H05B 33/14 |

FOREIGN PATENT DOCUMENTS

JP    2012-023388 A    2/2012

* cited by examiner

*Primary Examiner* — Daniel Whalen
(74) *Attorney, Agent, or Firm* — ScienBiziP, P.C.

(57) ABSTRACT

A light-emitting element includes a hole transport layer between a light-emitting layer and an anode, the hole transport layer containing either a metal oxide of $(NiO)_{1-x}(LaNiO_3)_x$ (composition formula 1) or $(Cu_yO)_{1-x}(LaNiO_3)_x$ (composition formula 2), where $0 < x \le 1$ and $1 \le y \le 2$.

10 Claims, 6 Drawing Sheets

LIGHT-EMITTING ELEMENT HAVING A HOLE TRANSPORT LAYER CONTAINING LANIO.SUB.3 FOR LUMINOUS EFFICIENCY

TECHNICAL FIELD

The disclosure relates to light-emitting elements containing quantum dots.

BACKGROUND ART

Patent Literature 1 discloses a light-emitting device containing semiconductor nanocrystals. This light-emitting device includes a light-emitting element including a hole transport layer of NiO which is an inorganic material. Light-emitting devices including a light-emitting element including a hole transport layer of an inorganic material are preferred to light-emitting devices including a light-emitting element including a hole transport layer of an organic material because the material per se is more stable to, for example, oxygen, water, and ultraviolet light, and the light-emitting devices are therefore more reliable.

CITATION LIST

Patent Literature

Patent Literature 1: Japanese Unexamined Patent Application Publication, Tokukai, No. 2012-23388 (Publication Date: Feb. 2, 2012)

SUMMARY

Technical Problem

A quantum dot typically has an ionization potential of 6 to 7 eV relative to the vacuum energy level thereof. Meanwhile, NiO, which is an inorganic material, has an ionization potential of 5.5 eV. There is hence a difference as large as 0.5 to 1.5 eV in ionization potential between NiO and a quantum dot.

For these reasons, the light-emitting element exhibits a poor efficiency in transporting holes from the hole transport layer to the light-emitting layer if the hole transport layer contains a known inorganic material and the light-emitting layer contains quantum dots. Accordingly, in the light-emitting element including a hole transport layer of a known inorganic material, the efficiency of hole transport from the hole transport layer to the light-emitting layer is not well balanced with the efficiency of electron transport from the electron transport layer to the light-emitting layer, which leads to declines in the luminous efficiency of the light-emitting element.

Solution to Problem

To address these issues, the present invention disclosure is directed to a light-emitting element including: an anode; a cathode; a light-emitting layer between the anode and the cathode, the light-emitting layer containing quantum dots; and a hole transport layer between the light-emitting layer and the anode, the hole transport layer containing either a metal oxide of $(NiO)_{1-x}(LaNiO_3)_x$ (composition formula 1) or $(Cu_yO)_{1-x}(LaNiO_3)_x$ (composition formula 2), where $0<x\leq 1$ and $1\leq y\leq 2$.

Advantageous Effects of Disclosure

This structure improves the efficiency of hole transport from the hole transport layer to the light-emitting layer in a light-emitting element including a hole transport layer containing an inorganic material. That in turn improves balance between the efficiency of hole and electron transport to the light-emitting layer. The disclosure can hence provide a light-emitting device including a light-emitting element that exhibits an improved luminous efficiency and at least known levels of reliability.

DESCRIPTION OF EMBODIMENTS

Embodiment 1

Figure 1:
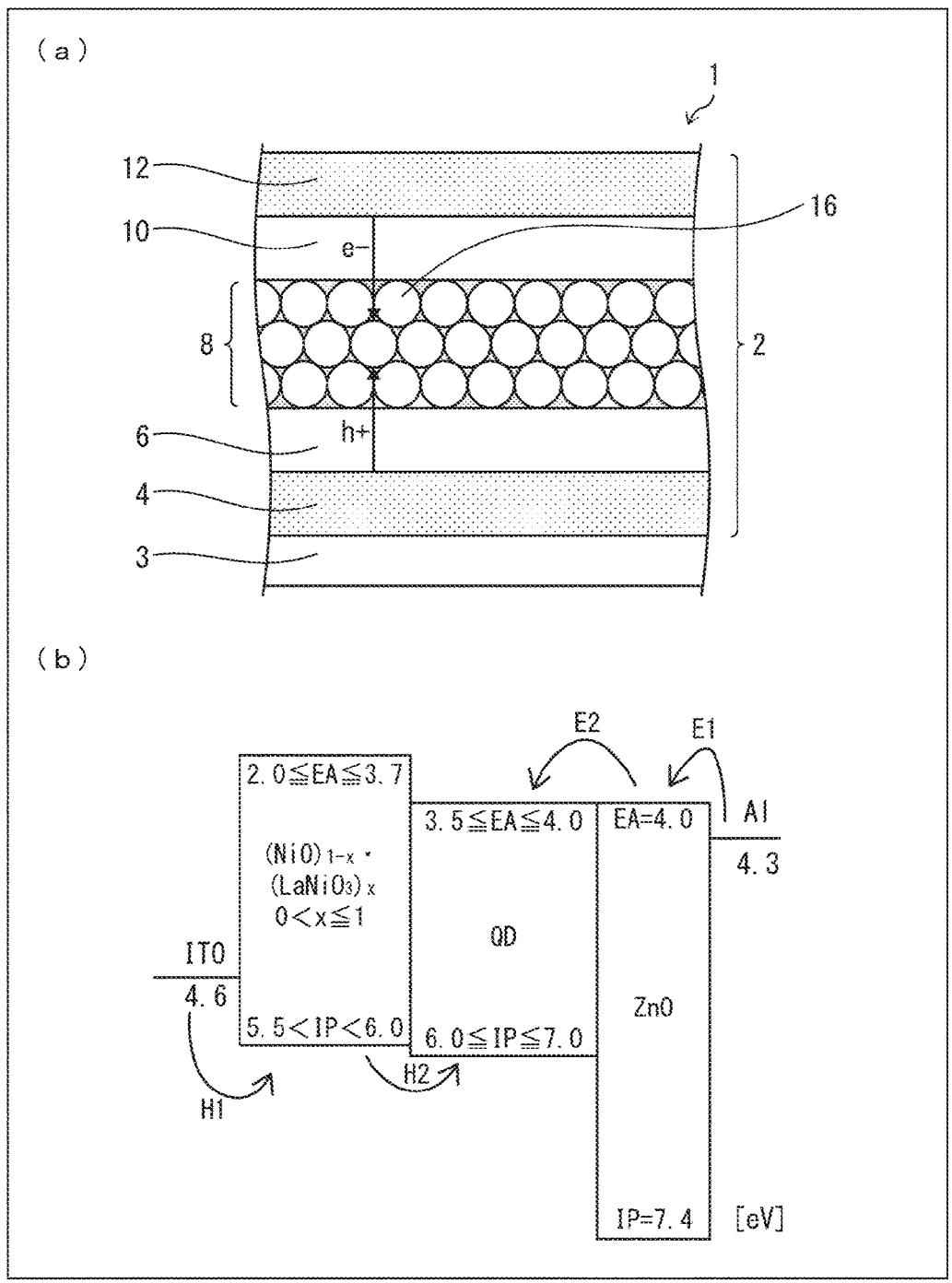
FIG. 1(a) is a schematic cross-sectional view of a light-emitting device in accordance with Embodiment 1.
FIG. 1(b) is an energy diagram representing an example of the Fermi level (FL) or the electron affinity (EA) and ionization potential (IP) of each layer in a light-emitting element in the light-emitting device.

FIG. 1(a) is a schematic cross-sectional view of a light-emitting device 1 in accordance with the present embodiment. FIG. 1(b) is an energy diagram representing an example of the Fermi level or the electron affinity and ionization potential of each layer in a light-emitting element 2 in accordance with the present embodiment.

As shown in FIG. 1(a), the light-emitting device 1 in accordance with the present embodiment includes the light-emitting element 2 and an array substrate 3. The light-emitting device 1 includes a stack of layers that constitutes the light-emitting element 2 on the array substrate 3 including thin film transistors (TFTs) (not shown). Throughout the present specification, the direction from the light-emitting element 2 toward the array substrate 3 in the light-emitting device 1 is referred to as "downward," and the direction from the array substrate 3 toward the light-emitting element 2 in the light-emitting device 1 as "upward."

The light-emitting element 2 includes, on an anode 4, a hole transport layer 6, a light-emitting layer 8, an electron transport layer 10, and a cathode 12 in this sequence when viewed from the bottom. The anode 4 of the light-emitting element 2, residing in a layer overlying the array substrate 3, is electrically connected to one of the thin film transistors in the array substrate 3.

The anode 4 and the cathode 12 contain a conductive material and are electrically connected to the hole transport layer 6 and the electron transport layer 10 respectively.

Either the anode 4 or the cathode 12 is a transparent electrode. The transparent electrode may be made of, for example, ITO, IZO, ZnO, AZO, or BZO by, for example, sputtering. Either the anode 4 or the cathode 12 may contain a metal material. The metal material is preferably Al, Cu, Au, Ag, or a like material that is highly reflective to light in the visible range.

The light-emitting layer 8 is a stack of one to several quantum dots (semiconductor nanoparticles) 16. The light-emitting layer 8 can be formed of a dispersion solution containing quantum dots 16 dispersed in a medium such as hexane or toluene, by spin-coating or inkjet printing. The dispersion solution may additionally contain a dispersant such as thiol or amine. The light-emitting layer 8 preferably has a thickness of 5 to 50 nm.

The quantum dots 16 have a valence band and a conduction band and emit light when the holes in the valence, band and the electrons in the conduction band recombine. The emission from the quantum dots 16 has a narrow spectrum due to the quantum confinement effect and hence exhibits a relatively deep chromaticity.

The quantum dots 16 may be semiconductor nanoparticles that have a core/shell structure including, for example, a CdSe core and a ZnS shell. Alternatively, the quantum dots 16 may have a core/shell structure such as a CdSe/CdS, CdSe/ZnS, InP/ZnS, ZnSe/ZnS, or CIGS/ZnS structure.

The quantum dots 16 have a particle diameter of approximately 3 to 10 nm. The wavelength of the emission from the quantum dots 16 is controllable through the particle diameter of the quantum dots 16. Therefore, the wavelength of the light emitted by the light-emitting device 1 can be controlled by controlling the particle diameter of the quantum dots 16.

The hole transport layer 6 transports holes from the anode 4 to the light-emitting layer 8. The hole transport layer 6 is made of an inorganic material and has an ionization potential in excess of 5.5 eV relative to the vacuum energy level thereof.

In the present embodiment, the hole transport layer 6 contains a metal oxide of $(NiO)_{1-x}(LaNiO_3)_x$ (composition formula 1) where $0<x\leq1$.

This mixed crystal structure of NiO and $LaNiO_3$ can impart a higher ionization potential to the hole transport layer 6 than a solitary crystal structure of NiO, thereby improving hole injection efficiency. That in turn improves the electron-hole balance and hence the luminous efficiency of the light-emitting element 2.

The hole transport layer 6 may partially contain $LaNiO_3$.

The variable x is preferably such that $0.4 \leq x < 1$. The metal oxides of composition formula 1 have a primarily perovskite crystal structure when x is in this numerical range.

The variable x is more preferably such that $0.4 \leq x < 0.9$. This numerical range improves electron blocking effect. When x is in excess of 0.9, the electrons from the quantum dots 16 make a transition, which could disadvantageously reduce the luminous efficiency of the light-emitting element 2.

The metal oxide of composition formula 1 in the hole transport layer 6 preferably contains a dopant. The dopant preferably contains at least one of species selected from the group consisting of Li, Mg, Cu, Al, and Ti. These dopants are selected from those elements that can be substituted for Ni in the $LiNiO_3$ crystal structure.

The dopant preferably has a concentration of $1.00 \times e^{17}$ to $1.00 \times e^{23}$ cm$^{-3}$.

The hole transport layer 6 may have a higher ionization potential than does the light-emitting layer 8. The ionization potentials of the light-emitting layer 8 and the hole transport layer 6 preferably differ by not more than 0.5 eV.

The hole transport layer 6 may be formed by sputtering. The hole transport layer 6 preferably has a thickness of 5 to 40 nm.

The electron transport layer 10 transports electrons from the cathode 12 to the light-emitting layer 8. The electron transport layer 10 may have a function of disrupting hole transport. The electron transport layer 10 may contain, for example, ZnO, $TiO_2$, $Ta_2O_3$, or $SrTiO_3$ and be formed by sputtering. The electron transport layer 10 may have a known, publicly known thickness, preferably from 10 to 100 nm.

The hole transport layer 6 and the electron transport layer 10 may be nanoparticulate, crystalline, polycrystalline, or amorphous.

FIG. 1(b) is an energy diagram representing an example of the Fermi level or the electron affinity and ionization potential of each layer in the light-emitting element 2 in accordance with the present embodiment. The diagram shows ITO (anode 4), $(NiO)_{1-x}(LaNiO_3)_x$ (hole transport layer 6), CdSe (QD, light-emitting layer 8), ZnO (electron transport layer 10), and Al (cathode 12) from left to right in FIG. 1(b).

The Fermi levels of the anode 4 and the cathode 12 are shown in units of eV. Below the hole transport layer 6, the light-emitting layer 8, and the electron transport layer 10, the ionization potentials of these layers are shown in units of eV relative to the vacuum energy level thereof. Above the hole transport layer 6, the light-emitting layer 8, and the electron transport layer 10, the electron affinities of these layers are shown in units of eV relative to the vacuum energy level thereof.

Ionization potentials and electron affinities will be described relative to the vacuum energy level throughout the rest of the specification unless otherwise mentioned.

The present embodiment gives an example where the anode 4 is made of ITO and the cathode 12 is made of Al (see FIG. 1(b)). In this example, the anode 4 has a Fermi level of 4.6 eV, and the cathode 12 has a Fermi level of 4.3 eV.

In the present embodiment, the hole transport layer 6 contains a metal oxide of $(NiO)_{1-x}(LaNiO_3)_x$ (composition formula 1) where $0<x\leq1$ as described above.

This hole transport layer 6 has an ionization potential of 5.5 eV to 6.0 eV, both exclusive, and an electron affinity of 2.0 eV to 3.7 eV, both inclusive.

The hole transport layer 6 may have a higher ionization potential than does the light-emitting layer 8. The ionization potentials of the light-emitting layer 8 and the hole transport layer 6 preferably differ by not more than 0.5 eV. If the ionization potentials of the light-emitting layer 8 and the hole transport layer 6 differ by not more than 0.5 eV, the ionization potential of the hole transport layer 6 may be lower than the ionization potential of the light-emitting layer 8.

The present embodiment gives an example where the electron transport layer 10 is made of ZnO (see FIG. 1(b)).

In this example, the electron transport layer 10 has an ionization potential of 7.4 eV and an electron affinity of 4.0 eV.

The light-emitting layer 8 has an ionization potential of 6.0 to 7.0 eV and an electron affinity of 3.5 to 4.0 eV in the present embodiment although these values can vary with the material and particle diameter of the quantum dots 16.

Figure 2:
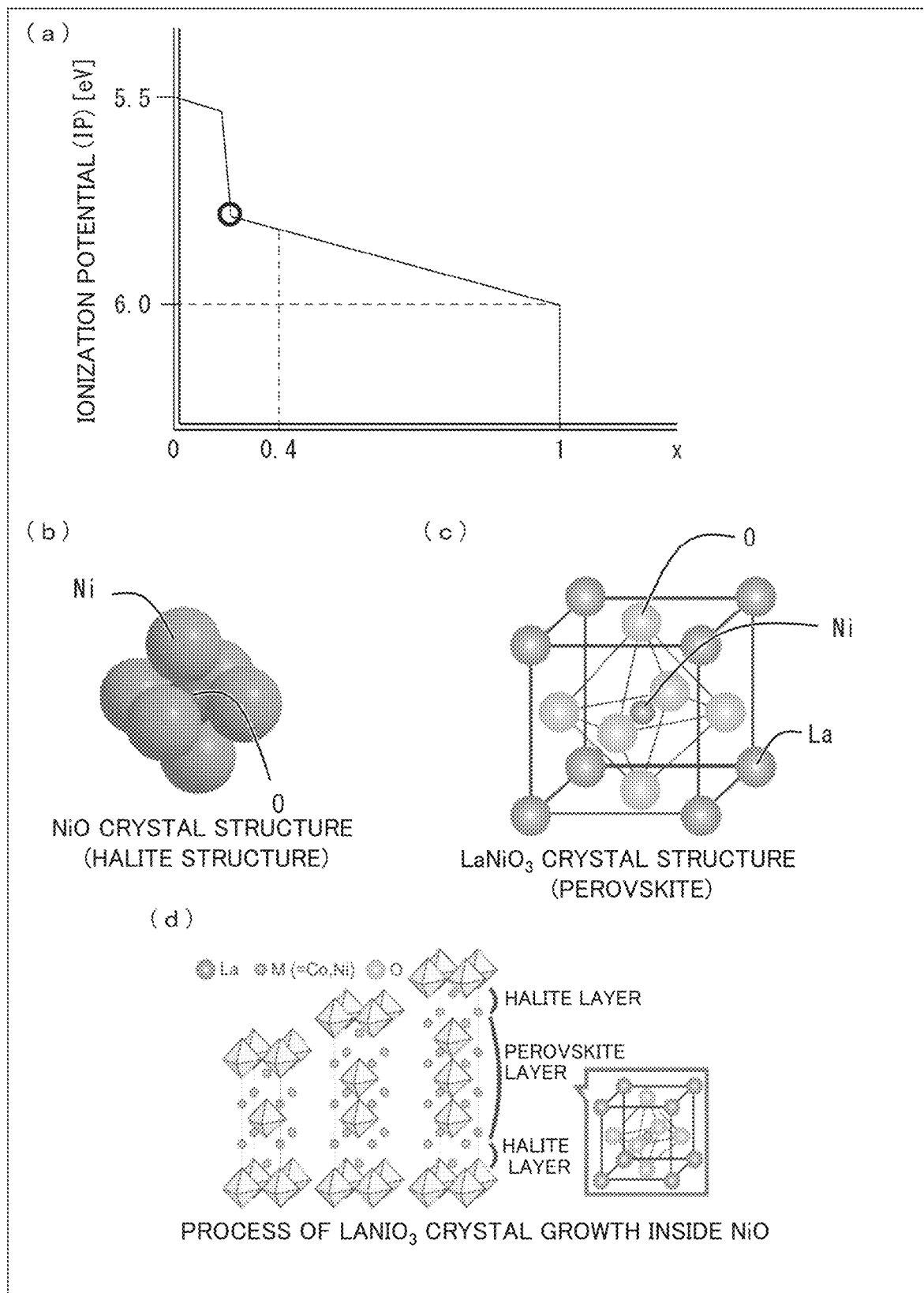
FIG. 2(a) is a graph representing a relationship between the composition and ionization potential of a hole transport layer in the light-emitting device.
FIG. 2(b) is a perspective view of the structure of a NiO crystal in the hole transport layer.
FIG. 2(c) is a perspective view of the structure of a LaNiO$_3$ crystal in the hole transport layer.
FIG. 2(d) is a perspective view of a growth process of a LaNiO$_3$ crystal in a NiO crystal in the hole transport layer-6.

FIG. 2(a) is a graph representing a relationship between the composition and ionization potential of the hole transport layer 6 in the light-emitting device 1. FIG. 2(b) is a perspective view of the structure of a NiO crystal in the hole transport layer 6. FIG. 2(c) is a perspective view of the structure of a LaNiO$_3$ crystal in the hole transport layer 6. FIG. 2(d) is a perspective view of a growth process of a LaNiO$_3$ crystal in a NiO crystal in the hole transport layer 6. The drawings in FIG. 2(c) and FIG. 2(d) are reproduced from the respective online files:
https://repository.kulib.kyoto-u.ac.jp/dspace/bitstream/2433/225596/3/dkogk04308.pdf and
https://repository.kulib.kyoto-u.ac.jp/dspace/bitstream/2433/225596/3/dkogk04308.pdf.

In the hole transport layer 6, the metal oxide of $(NiO)_{1-x}(LaNiO_3)_x$ (composition formula 1) where $0<x\leq1$ changes from a primarily NiO crystal structure to a primarily LaNiO$_3$ crystal structure with an increasing value of x. It is inferred that this metal oxide has an ionization potential that sharply decreases when x increases approaching a point near 0.3, as shown in FIG. 2(a). The metal oxide substantially has the NiO crystal structure shown in FIG. 2(b) (halite structure) when $x\approx0$ and the LaNiO$_3$ crystal structure shown in FIG. 2(c) (perovskite) when $\approx1$. As x increases, the LaNiO$_3$ crystal grows inside the NiO crystal as shown in FIG. 2(d).

The hole transport layer 6 in accordance with the present embodiment can be formed, for example, by simultaneously sputtering NiO and LaO with the power of the sputtering apparatus being adjusted in such a suitable manner as to adjust the composition. As an example, NiO and LaO are simultaneously sputtered with the power of the sputtering apparatus being maintained at a constant level for NiO and gradually increased for LaO.

The light-emitting device 1 in accordance with the present embodiment has a light-emission mechanism that is described below in reference to FIG. 1.

In the light-emitting device 1, as an electrical potential difference is applied across the anode 4 and the cathode 12, the anode 4 injects holes, and the cathode 12 injects electrons, to the light-emitting layer 8. The holes from the anode 4 travel via the hole transport layer 6 and reaches the light-emitting layer 8 as indicated by arrow h+ in FIG. 1(a). The elections from the cathode 12 travel via the electron transport layer 10 and reaches the light-emitting layer 8 as indicated by arrow e− in FIG. 1(a).

Upon reaching the light-emitting layer 8, the holes and electrons recombine in the quantum dots 16, to emit light. The emission from the quantum dot 16 may, for example, reflect off the cathode 12, which is a metal electrode, and pass through the anode 4, which is a transparent electrode, and the array substrate 3 before exiting the light-emitting device 1.

The transport of holes and electrons through each layer of the light-emitting element 2 will be described with reference to FIG. 1(b).

As an electrical potential difference develops between the anode 4 and the cathode 12 in the light-emitting device 1, the anode 4 injects holes to the hole transport layer 6 as indicated by arrow H1 in FIG. 1(b). Likewise, the cathode 12 injects electrons to the electron transport layer 10 as indicated by arrow E1 in FIG. 1(b).

These holes are then transported from the hole transport layer 6 to the light-emitting layer 8, which is a quantum-dot layer, as indicated by arrow H2 in FIG. 1(b). The injection barrier in the transport of holes from the hole transport layer 6 to the light-emitting layer 8 in this example is equal to the energy that remains when the ionization potential of the hole transport layer 6 is subtracted from the ionization potential of the light-emitting layer 8. The injection barrier in the transport of holes from the hole transport layer 6 to the light-emitting layer 8 in the present embodiment is therefore from 0 to 0.5 eV.

Similarly, the electrons are transported from the electron transport layer 10 to the light-emitting layer 8 as indicated by arrow E2 in FIG. 1(b). The holes and electrons are transported to the light-emitting layer 8 in this manner and recombine in the quantum dots 16.

Figure 3:
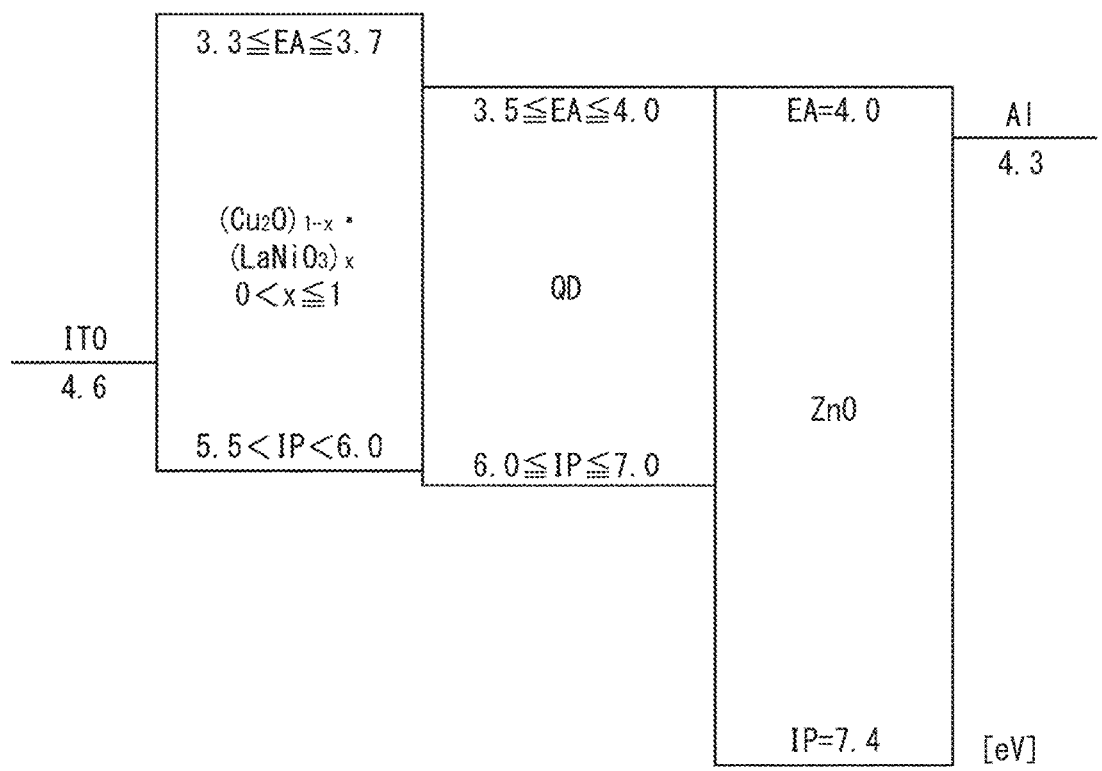
FIG. 3 is an energy diagram representing another example of the Fermi level or the electron affinity and ionization potential of each layer in the light-emitting element.

FIG. 3 is an energy diagram representing another example of the Fermi level or the electron affinity and ionization potential of each layer in the tight-emitting element 2.

The hole transport layer 6 may contain a metal oxide of $(Cu_yO)_{1-x}(LaNiO_3)_x$ (composition formula 2) where $0<x\leq1$ and $1\leq y\leq2$.

NiO detailed above (composition formula 1) may be replaced by Cu$_2$O or CuO. These Cu$_2$O and CuO have a low ionization potential and a low hole injection efficiency, similarly to NiO.

If Cu$_2$O is used as a replacement, the hole transport layer 6 has an ionization potential (IP) such that 5.5 eV<IP<6.0 eV and an electron affinity of 3.3 eV to 3.7 eV, both inclusive. If CuO is used as a replacement, the hole transport layer 6 has an ionization potential (IP) such that 5.5 eV<IP<6.0 eV and an electron affinity of 3.3 eV to 4.1 eV, both inclusive.

Hence, the metal oxide that is a mixed crystal of LaNiO$_3$ and either Cu$_2$O or CuO (composition formula 2) can provide effects similar to those provided by the aforementioned metal compound (composition formula 1).

Figure 4:
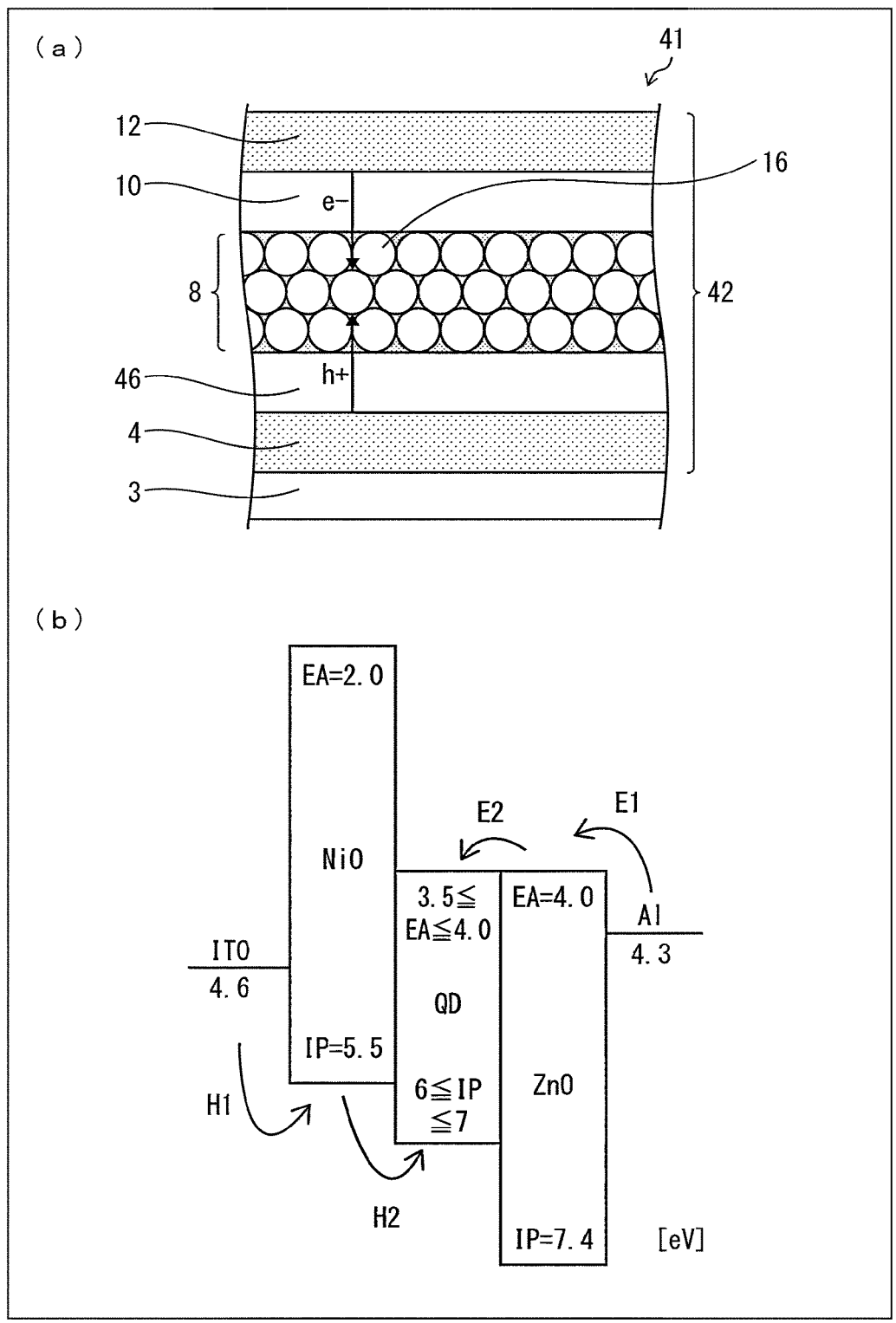
FIG. 4(a) is a schematic cross-sectional view of a light-emitting device in accordance with a comparative example.
FIG. 4(b) is an energy diagram representing an example of the Fermi level or the electron affinity and ionization potential of each layer in a light-emitting element in the light-emitting device.

FIG. 4(a) is a schematic cross-sectional view of a light-emitting device 41 in accordance with a comparative example. FIG. 4(b) is an energy diagram representing an example of the Fermi level or the electron affinity and ionization potential of each layer in a light-emitting element 42 in the light-emitting device 41. The light-emitting device 41 in accordance with the comparative example only differs from the light-emitting device 1 in accordance with the present embodiment in that the light-emitting element 42 includes a hole transport layer 46 of NiO.

The light-emitting device 41 emits light by a similar principle to the present embodiment. The injection barrier in the transport of holes from the hole transport layer 46 to the light-emitting layer 8 is 0.5 to 1.5 eV.

In contrast, in the light-emitting element 2 in accordance with the present embodiment, the hole transport layer 6 contains either a metal oxide of $(NiO)_{1-x}(LaNiO_3)_x$ (composition formula 1) or $(Cu_yO)_{1-x}(LaNiO_3)_x$ (composition formula 2) where $0<x\leq1$ and $1\leq y\leq2$.

The hole transport layer 6, containing this metal oxide, has an ionization potential in excess of 5.5 eV. The light-emitting element 2 in accordance with the present embodiment can therefore lower the injection barrier in the transport of holes from the hole transport layer 6 to the light-emitting layer 8 when compared with the light-emitting element 42 in accordance with the comparative example that includes the hale transport layer 46 of NiO. Hence, the light-emitting device 1 in accordance with the present embodiment can improve luminous efficiency without compromising on reliability.

Embodiment 2

Figure 5:
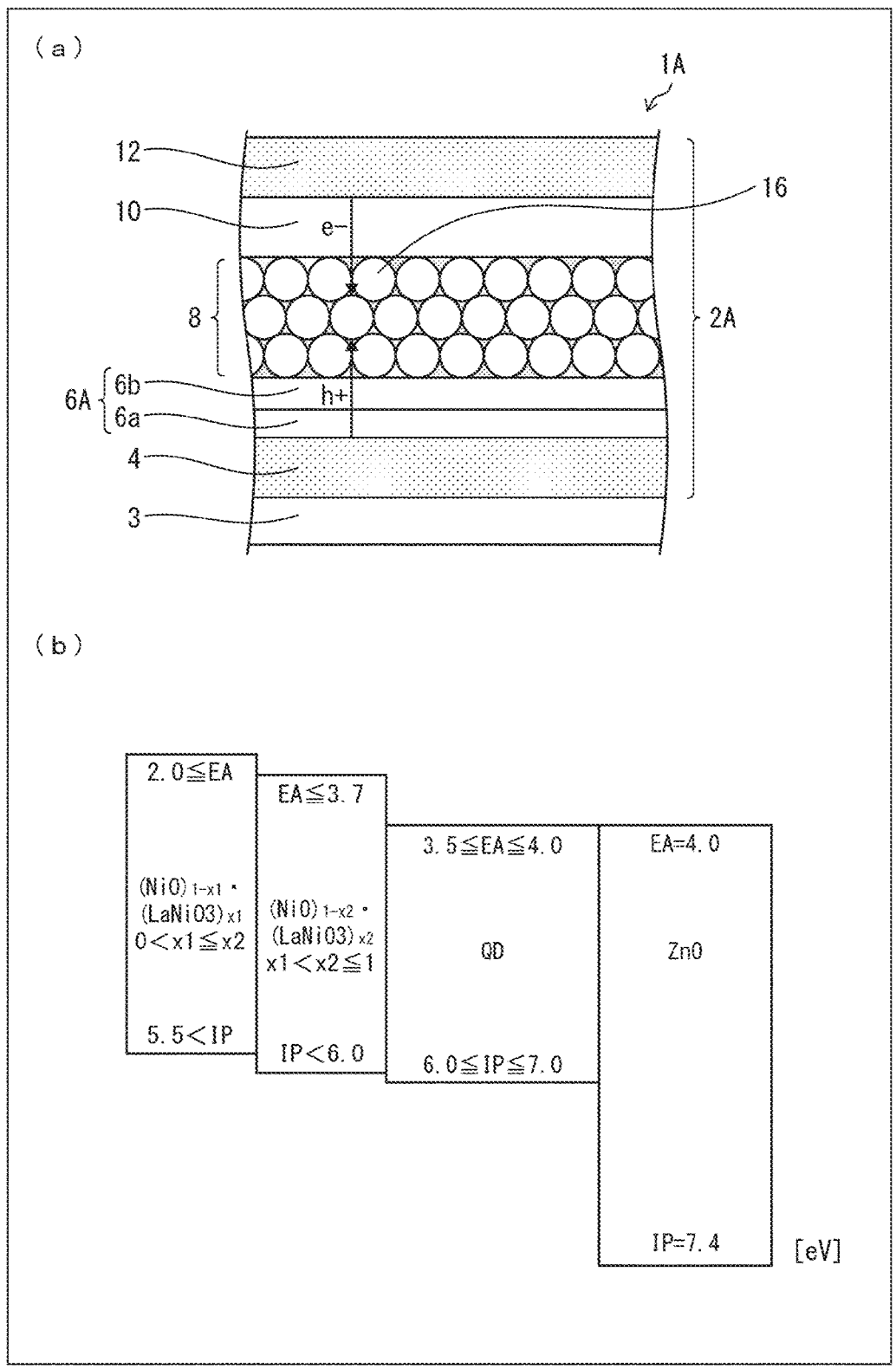
FIG. 5(a) is a schematic cross-sectional view of a light-emitting device in accordance with Embodiment 2.
FIG. 5(b) is an energy diagram representing an example of the Fermi level or the electron affinity and ionization potential of each layer in a light-emitting element in the light-emitting device.

FIG. 5(*a*) is a schematic cross-sectional view of a light-emitting device 1A in accordance with Embodiment 2. FIG. 5(*b*) is an energy diagram representing an example of the Fermi level or the electron affinity and ionization potential of each layer in a light-emitting element 2 in the light-emitting device 1A. Members of the present embodiment that are similar to those described earlier are indicated by similar reference numerals, and description thereof is not repeated.

The light-emitting device 1A differs from the light-emitting device 1 in accordance with Embodiment 1 described above in that the former includes a double-layered hole transport layer 6A. The hole transport layer 6A includes a first hole transport layer 6*a* closer to the anode 4 than to the light-emitting layer 8 and a second hole transport layer 6*b* closer to the light-emitting layer 8 than to the anode 4.

The first hole transport layer 6*a* primarily contains a metal oxide of $(NiO)_{1-x1}(LaNiO_3)_{x1}$ (composition formula 3).

The second hole transport layer 6*b* primarily contains a metal oxide of $(NiO)_{1-x2}(LaNiO_3)_{x2}$ (composition formula 4).

In these formulas, $0 \leq x1 < x2 \leq 1$.

The first hole transport layer 6*a* has an ionization potential IP in excess of 5.5 eV and an electron affinity of not less than 2.0 eV. The second hole transport layer 6*b* has an ionization potential IP of less than 6.0 eV and an electron affinity of not more than 3.7 eV.

The First hole transport layer 6*a* and the second hole transport layer 6*b* containing the respective metal oxides given above have an ionization potential IP in excess of 5.5 eV and therefore provide effects similar to those provided by Embodiment 1.

Embodiment 3

Figure 6:
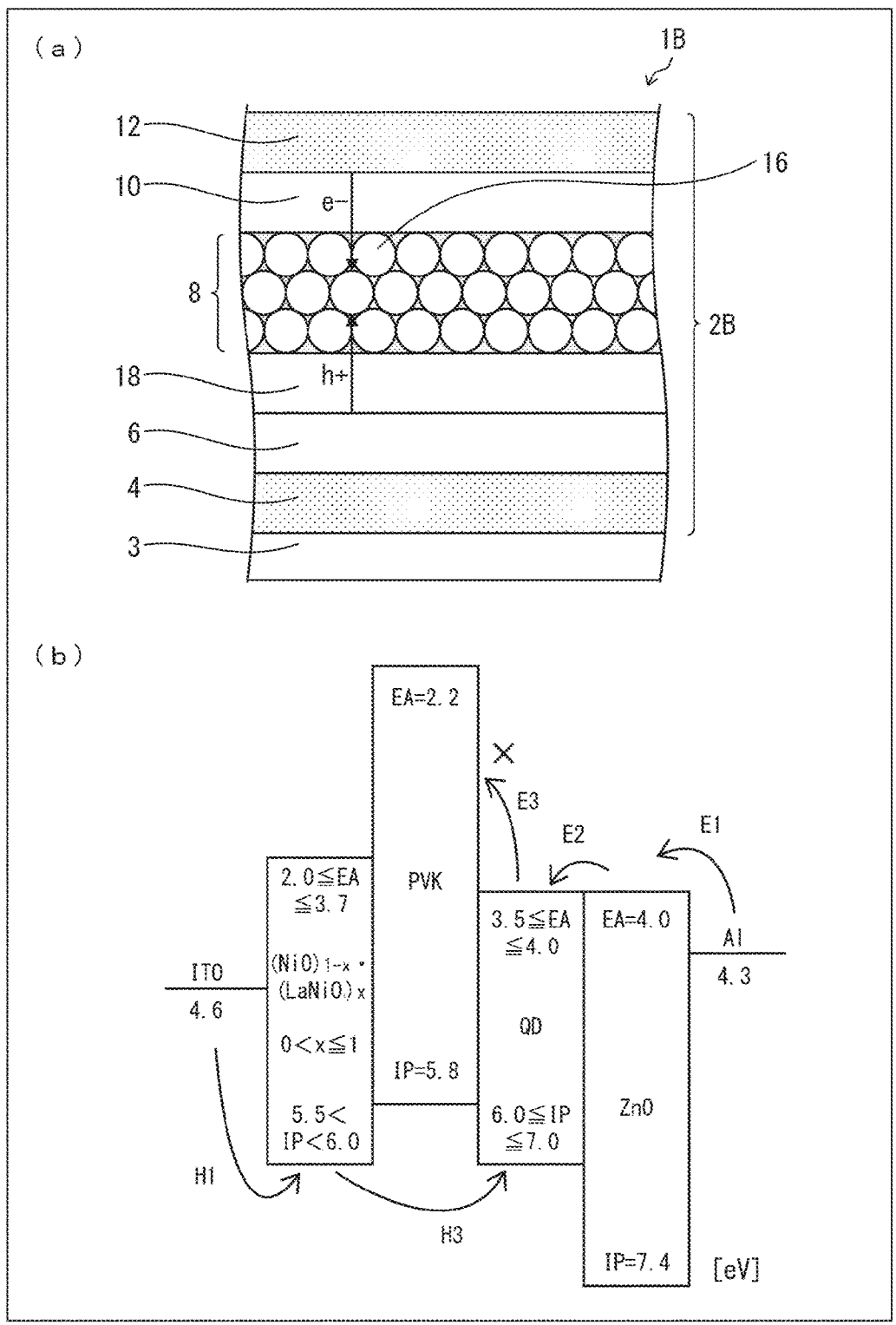
FIG. 6(a) is a schematic cross-sectional view of a light-emitting device in accordance with Embodiment 3.
FIG. 6(b) is an energy diagram representing an example of the Fermi level or the electron affinity and ionization potential of each layer in a light-emitting element in the light-emitting device.

FIG. 6(*a*) is a schematic cross-sectional view of a light-emitting device in accordance with Embodiment 3. FIG. 6(*b*) is an energy diagram representing an example of the Fermi level or the electron affinity and ionization potential of each layer in a light-emitting element in the light-emitting device. Members of the present embodiment that are similar to those described earlier are indicated by similar reference numerals, and description thereof is not repeated.

A light-emitting device 1B in accordance with Embodiment 3 only differs from the light-emitting device 1 in accordance with Embodiment 1 in that the former includes an electron blocking layer 18 between a hole transport layer 6 and a light-emitting layer 8.

The electron blocking layer 18 preferably has a lower electron affinity than does the hole transport layer 6. The electron blocking layer 18 preferably has a lower electron affinity than does the light-emitting layer 8, by greater than or equal to 0.5 eV. The electron blocking layer 18 preferably has an electron affinity lower than 3.5 eV relative to the vacuum energy level thereof.

The electron blocking layer 18 has a function of preventing electrons from leaking from the light-emitting layer 8 to the hole transport layer 6. The electron blocking layer 18 may contain an inorganic material such as $Cu_2O$, $LiNbO_3$, $LiCoO_2$, $Al_2O_3$, $SiO_2$, or $SiN$ or an organic material such as PVK, TFB, or poly-TPD.

FIG. 6(*b*) shows the electron blocking layer 18, which is missing in FIG. 1(*b*), between the hole transport layer 6 and the light-emitting layer 8. FIG. 6(*b*) shows an example where the electron blocking layer 18 is formed of PVK. The electron blocking layer 18 in accordance with Embodiment 3 has an ionization potential of 5.8 eV and an electron affinity of 2.2 eV as shown in FIG. 6(*b*).

As described here, the electron blocking layer 18 preferably has a lower electron affinity than do the hole transport layer 6 and the light-emitting layer 8. In addition, the electron blocking layer 18 preferably has a lower ionization potential than either one or both of the hole transport layer 6 and the light-emitting layer 8.

The transport of holes and electrons between each layer of a light-emitting element 2B will be described with reference to FIG. 6(*b*).

As an electrical potential difference develops between the anode 4 and the cathode 12 in the light-emitting device 1B, holes and electrons are injected as in the preceding embodiments. These holes are transported from the anode 4 to the hole transport layer 6 and then to the light-emitting layer 8 as indicated by arrow H3 in the present embodiment, because the electron blocking layer 18 has a lower ionization potential than do the hole transport layer 6 and the light-emitting layer 8 as shown in FIG. 6(*b*), and the barrier in the transport of holes from the hole transport layer 6 to the light-emitting layer 8 therefore does not increase.

Additionally, in the present embodiment, the electrons transported from the cathode 12 to the light-emitting layer 8 via the electron transport layer 10 will attempt to move further toward the electron blocking layer 18 as indicated by arrow E3. The electron blocking layer 18, however, having a lower electron affinity than does the tight-emitting layer 8, provides an increased barrier in the injection of electrons from the light-emitting layer 8 to the electron blocking layer 18. This increased barrier prevents the electrons transported to the light-emitting layer 8 from being injected to the electron blocking layer 18, thereby reducing electrons leaking to the hole transport layer 6 and the anode 4.

The light-emitting element 2B in accordance with the present embodiment includes the electron blocking layer 18 for preventing electrons from being injected from the light-emitting layer 8 to the hole transport layer 6. The light-emitting device 1B in accordance with the present embodiment can therefore restrain the electrons transported to the light-emitting layer 8 from leaking to the hole transport layer 6 when compared with the light-emitting device 1 in accordance with the preceding embodiments. Accordingly, holes and electrons more efficiently recombine in the light-emitting layer 8, which can in turn improve the luminous efficiency of the light-emitting device 1.

Summation

The disclosure, in aspect 1 thereof, is directed to a light-emitting element including: an anode; a cathode; a light-emitting layer between the anode and the cathode, the light-emitting layer containing quantum dots; and a hole transport layer between the light-emitting layer and the anode, the hole transport layer containing either a metal oxide of $(NiO)_{1-x}(LaNiO_3)_x$ (composition formula 1) or $(Cu_yO)_{1-x}(LaNiO_3)_x$ (composition formula 2), where $0 < x \leq 1$ and $1 \leq y \leq 2$.

In aspect 2, the light-emitting element is configured such that the hole transport layer further contains $LaNiO_3$.

In aspect 3, the light-emitting element is configured such that $0.4 \leq x < 1$.

In aspect 4, the light-emitting element is configured such that $0.4 \leq x < 0.9$.

In aspect 5, the light-emitting element is configured such that the hole transport layer includes a first hole transport layer closer to the anode than to the light-emitting layer and a second hole transport layer closer to the light-emitting layer than to the anode, the first hole transport layer primarily contains a metal oxide of $(NiO)_{1-x1} (LaNiO_3)_{x1}$ (composition formula 3), and the second hole transport layer primarily contains a metal oxide of $(NiO)_{1-x2} (LaNiO_3)_{x2}$ (composition formula 4), where $0 \leq x1 < x2 \leq 1$.

In aspect 6, the light-emitting element is configured such that the hole transport layer includes a first hole transport layer closer to the anode than to the light-emitting layer and a second hole transport layer closer to the light-emitting layer than to the anode, the first hole transport layer primarily contains a metal oxide of $(Cu_yO)_{1-x1} (LaNiO_3)_{x1}$ (composition formula 5), and the second hole transport layer primarily contains a metal oxide of $(Cu_yO)_{1-x2} (LaNiO_3)_{x2}$ (composition formula 6), where $0 \leq x1 < x2 \leq 1$.

In aspect 7, the light-emitting element is configured such that the metal oxide of composition formula 1 in the hole transport layer contains a dopant including at least one species selected from the group consisting of Li, Mg, Cu Al, and Ti. These elements can be substituted for Ni in the NiO or LaNiO$_3$ crystal structure, thereby increasing or decreasing the concentration of holes in the hole transport layer.

In aspect 8, the light-emitting element is configured such that the dopant has a concentration of $1.00 \times e^{17}$ to $1.00 \times e^{23}$ cm$^{-3}$. If the dopant has a concentration lower than $1.00 \times e^{17}$, the dopant may fail to change the concentration of holes in the hole transport layer. If the dopant has a concentration in excess of $100 \times e^{23}$, crystals may be distorted, which can cause undesirable cracks.

In aspect 9, the light-emitting element is configured such that the hole transport layer has an ionization potential that is either higher than or different by not more than 0.5 eV frons an ionization potential of the light-emitting layer.

In aspect 10, the light-emitting element is configured to further include an electron blocking layer between the light-emitting layer and the hole transport layer, the electron blocking layer having a lower electron affinity than does the hole transport layer.

In aspect 11, the light-emitting element is configured such that the electron affinity of the electron blocking layer is lower than an electron affinity of the light-emitting layer by at least 0.5 eV.

In aspect 12, the light-emitting element is configured such that the electron affinity of the electron blocking layer is lower than 3.5 eV, relative to a vacuum energy level thereof.

The disclosure is not limited to the description of the embodiments above and may be altered within the scope of the claims. Embodiments based on a proper combination of technical means disclosed in different embodiments are encompassed in the technical scope of the disclosure. Furthermore, new technological features can be created by combining different technical means disclosed in the embodiments.

The invention claimed is:

1. A light-emitting element comprising:
   an anode;
   a cathode;
   a light-emitting layer between the anode and the cathode, the light-emitting layer containing quantum dots; and
   a hole transport layer between the light-emitting layer and the anode, the hole transport layer containing either a metal oxide of $(NiO)_{1-x}(LaNiO_3)_x$ (composition formula 1) or $(Cu_yO)_{1-x}(LaNiO_3)_x$ (composition formula 2), where $0.4 \leq x < 1$ and $1 \leq y \leq 2$.

2. The light-emitting element according to claim 1, wherein $0.4 \leq x < 0.9$.

3. The light-emitting element according to claim 1, wherein the metal oxide of composition formula 1 in the hole transport layer contains a dopant including at least one species selected from the group consisting of Li, Mg, Cu, Al, and Ti.

4. The light-emitting element according to claim 3, wherein the dopant has a concentration of $1.00 \times e^{17}$ to $1.00 \times e^{23}$ cm$^{-3}$.

5. The light-emitting element according to claim 1, wherein the hole transport layer has an ionization potential that is either higher than or different by not more than 0.5 eV from an ionization potential of the light-emitting layer.

6. The light-emitting element according to claim 1, further comprising an electron blocking layer between the light-emitting layer and the hole transport layer, the electron blocking layer having a lower electron affinity than the hole transport layer.

7. The light-emitting element according to claim 6, wherein the electron affinity of the electron blocking layer is lower than an electron affinity of the light-emitting layer by at least 0.5 eV.

8. The light-emitting element according to claim 6, wherein the electron affinity of the electron blocking layer is lower than 3.5 eV, relative to a vacuum energy level thereof.

9. A light-emitting element comprising:
   an anode;
   a cathode;
   a light-emitting layer between the anode and the cathode, the light-emitting layer containing quantum dots; and
   a hole transport layer between the light-emitting layer and the anode, the hole transport layer containing either a metal oxide of $(NiO)_{1-x}(LaNiO_3)_x$ (composition formula 1) or $(Cu_yO)_{1-x}(LaNiO_3)_x$ (composition formula 2), where $0 < x \leq 1$ and $1 \leq y \leq 2$, wherein
   the hole transport layer includes a first hole transport layer closer to the anode than to the light-emitting layer and a second hole transport layer closer to the light-emitting layer than to the anode,
   the first hole transport layer primarily contains a metal oxide of $(NiO)_{1-x1} (LaNiO_3)_{x1}$ (composition formula 3), and
   the second hole transport layer primarily contains a metal oxide of $(NiO)_{1-x2} (LaNiO_3)_{x2}$ (composition formula 4), where $0 \leq x1 < x2 \leq 1$.

10. A light-emitting element comprising:
    an anode;
    a cathode;
    a light-emitting layer between the anode and the cathode, the light-emitting layer containing quantum dots; and
    a hole transport layer between the light-emitting layer and the anode, the hole transport layer containing either a metal oxide of $(NiO)_{1-x}(LaNiO_3)_x$ (composition formula 1) or $(Cu_yO)_{1-x}(LaNiO_3)_x$ (composition formula 2), where $0 < x \leq 1$ and $1 \leq y \leq 2$, wherein
    the hole transport layer includes a first hole transport layer closer to the anode than to the light-emitting layer and a second hole transport layer closer to the light-emitting layer than to the anode,
    the first hole transport layer primarily contains a metal oxide of $(Cu_yO)_{1-x1} (LaNiO_3)_{x1}$ (composition formula 5), and the second hole transport layer primarily contains a metal oxide of $(Cu_yO)_{1-x2}(LaNiO_3)\times 2$ (composition formula 6), where $0 \leq x1 < x2 \leq 1$.

* * * * *